US012113550B1

(12) United States Patent
Fay

(10) Patent No.: US 12,113,550 B1
(45) Date of Patent: Oct. 8, 2024

(54) ENHANCED TEARING SAVE ENCODING

(71) Applicant: NXP B.V., Eindhoven (NL)

(72) Inventor: Björn Fay, Brande-Hörnerkirchen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/331,499

(22) Filed: Jun. 8, 2023

(51) Int. Cl.
*H03M 13/19* (2006.01)
*G06F 11/10* (2006.01)
*H03M 13/00* (2006.01)
*H03M 13/09* (2006.01)

(52) U.S. Cl.
CPC ......... *H03M 13/19* (2013.01); *G06F 11/1012* (2013.01); *G06F 11/1076* (2013.01); *H03M 13/09* (2013.01)

(58) Field of Classification Search
CPC ............ G06F 11/1012; G06F 11/1076; H03M 13/2906; H03M 13/09; H03M 13/19
See application file for complete search history.

(56) References Cited

U.S. PATENT DOCUMENTS

| | | | | |
|---|---|---|---|---|
| 7,149,955 B1 * | 12/2006 | Sutardja | ................ | H04L 1/0054 714/809 |
| 8,499,192 B2 * | 7/2013 | Rousseau | .............. | G06F 3/0616 714/49 |
| 9,369,486 B2 * | 6/2016 | Lewis | ..................... | H04L 9/003 |
| 10,944,435 B1 | 3/2021 | Fay | | |
| 11,636,057 B2 * | 4/2023 | Ipek | .................... | G06F 13/1694 711/117 |
| 11,748,274 B2 * | 9/2023 | Li | ........................ | H03M 13/19 711/163 |

OTHER PUBLICATIONS

J. M. Berger, "A Note on Error Detection Codes for Asymmetric Channels," IBM Advanced Systems Development Division, Information and Control vol. 4, pp. 68-73, 1961, Yorktown Heights, N.Y.
Thabit Sultan Mohammed et al., "A Universal Decoding Algorithm for t-EC/AUED Codes," Asian Jornal of Information Technology 13, 2014, pp. 787-790, vol. 12, Medwell Journals.
Jehoshua Bruck et al., "Some New EC/AUED Codes," 1989, pp. 208-215, San Jose, California.
Irina Naydenova, et al., "Optimal Binary and Ternary t-EC-AUED Codes," Reports in Informatics, Report No. 377, Nov. 2008, ISSN 0333-3590, Bergen, Norway.

* cited by examiner

*Primary Examiner* — Justin R Knapp

(57) ABSTRACT

A method for encoding data to be stored in a memory, including: encoding the data to be stored in memory with an error correcting code (ECC) as first encoded data, wherein the ECC is configured to have a minimum Hamming distance of at least $4t+1$ in order to correct up to t bit errors and detect up to 3t bit errors where $t \geq 1$; determining a Hamming weight of the first encoded data; encoding the determined Hamming weight, wherein for all higher Hamming weights the encoding should have at least $2t+1$ bit-positions that change from 1 to 0 per Hamming weight; concatenating the first encoded data and the encoded Hamming weight as concatenated data; and storing the concatenated data in the memory.

18 Claims, 3 Drawing Sheets

ENHANCED TEARING SAVE ENCODING

FIELD OF THE DISCLOSURE

Various exemplary embodiments disclosed herein relate to enhanced tearing save encoding.

BACKGROUND

When data is written to a memory or the memory is erased and that operation is interrupted, tearing occurs. Tearing can occur in various ways and settings. For example, an RFID chip often receives external power via an RF signal from a reader, and if data is being written to the memory of the RFID chip and the device moves out of range of the power source, the write operation may be interrupted and tearing occurs. A similar situation may occur when the memory is being erased. This tearing can lead to corrupted data in the memory. In other low power and internet of things (IoT) scenarios, such tearing may also occur which leads to data corruption.

SUMMARY

A summary of various exemplary embodiments is presented below.

Various embodiments relate to a method for encoding data to be stored in a memory, including: encoding the data to be stored in memory with an error correcting code (ECC) as first encoded data, wherein the ECC is configured to have a minimum Hamming distance of at least $4t+1$ in order to correct up to t bit errors and detect up to 3t bit errors where $t \geq 1$; determining a Hamming weight of the first encoded data; encoding the determined Hamming weight, wherein for all higher Hamming weights the encoding should have at least $2t+1$ bit-positions that change from 1 to 0 per Hamming weight; concatenating the first encoded data and the encoded Hamming weight as concatenated data; and storing the concatenated data in the memory.

Various embodiments are described, wherein the encoding of the determined Hamming weight includes: inverting the determined Hamming weight; and concatenating $2t+1$ copies of the inverted Hamming weight.

Various embodiments are described, wherein the encoding of the determined Hamming weight includes encoding the determined Hamming weight with an error correcting code (ECC) as first encoded Hamming weight, wherein the ECC is configured to have a minimum Hamming distance of at least $2t+1$ where t is the same t as for the data encoding; inverting the first encoded Hamming weight; and concatenating the first encoded Hamming weight and the inverted first encoded Hamming weight.

Various embodiments are described, wherein when the Hamming weight is always even, the last significant bit of the Hamming weight is not used.

Further various embodiments relate to a method for decoding data stored in a memory, including: reading encoded data from the memory, wherein the encoded data includes the first encoded data, generated using an error correcting code (ECC), and the encoded Hamming weight, wherein for all higher Hamming weights the encoding should have at least $2t+1$ bit-positions that change from 1 to 0 per Hamming weight, and wherein the ECC is configured to have a minimum Hamming distance of at least $4t+1$ in order to correct up to t bit errors and detect up to 3t bit errors where $t \geq 1$; correcting the first encoded data with the ECC as corrected encoded data, including error detection of up to at least 3t errors and correction of up to t errors; decoding the corrected encoded data with the ECC as decoded data; decoding the encoded Hamming weight, including error correction and possibly checking for decoding errors; determining the Hamming weight of the corrected encoded data; checking that the decoded Hamming weight and the determined Hamming weight are equal, that the data decoding did not detect more than t errors, and the Hamming weight decoding has not detected a decoding error; and returning the decoded data if all checks have passed, otherwise returning an error.

Various embodiments are described, wherein the encoded Hamming weight includes $2t+1$ inverted Hamming weights, and the decoding of the encoded Hamming weight includes
  determining the bit-wise majority vote of the $2t+1$ inverted Hamming weights, and
  inverting the majority vote.

Various embodiments are described, wherein the decoding of the encoded Hamming weight includes trying all possible Hamming weights and checking if one would generate an encoding that has a Hamming distance of at most t to the encoded Hamming weight, returning the possible Hamming weight if it has passed the check, else returning an error.

Various embodiments are described, wherein the encoded Hamming weight includes a first encoded Hamming weight and an inverted second encoded Hamming weight, where the first and second encoded Hamming weights are each encoded with an error correcting code (ECC), wherein the ECC is configured to have a minimum Hamming distance of at least $2t+1$; and the decoding of the encoded Hamming weight includes decoding the first encoded Hamming weight with c1 corrections, inverting the inverted second encoded Hamming weight, decoding the second encoded Hamming weight with c2 corrections, checking if both decoding operations result in the same Hamming weight and if $c1+c2 \leq t$ bits were corrected, returning the first decoded Hamming weight if the check has been passed, else returning an error.

Various embodiments are described, wherein when the Hamming weight is always even, the last significant bit of the Hamming weight is not used.

Further various embodiments relate to a device configured to encode data stored in a first memory, including: a second memory; a processor coupled to the second memory, wherein the processor is further configured to: encode the data to be stored in memory with an error correcting code (ECC) as first encoded data, wherein the ECC is configured to have a minimum Hamming distance of at least $4t+1$ in order to correct up to t bit errors and detect up to 3t bit errors where $t \geq 1$; determine a Hamming weight of the first encoded data; encode the determined Hamming weight, wherein for all higher Hamming weights the encoding should have at least $2t+1$ bit-positions that change from 1 to 0 per Hamming weight; concatenate the first encoded data and the encoded Hamming weight as concatenated data; and store the concatenated data in the memory.

Various embodiments are described, wherein the encoding of the determined Hamming weight includes: inverting the determined Hamming weight; and concatenating $2t+1$ copies of the inverted Hamming weight.

Various embodiments are described, wherein the encoding of the determined Hamming weight includes encoding the determined Hamming weight with an error correcting code (ECC) as first encoded Hamming weight, wherein the ECC is configured to have a minimum Hamming distance of at least $2t+1$ where t is the same t as for the data encoding; inverting the first encoded Hamming weight; and concatenating the first encoded Hamming weight and the inverted first encoded Hamming weight.

Various embodiments are described, wherein when the Hamming weight is always even, the last significant bit of the Hamming weight is not used.

Further various embodiments relate to a device configured to decode data stored in a first memory, including: a second memory; a processor coupled to the second memory, wherein the processor is further configured to: read encoded data from the memory, wherein the encoded data includes the first encoded data, generated using an error correcting code (ECC), and the encoded Hamming weight, wherein for all higher Hamming weights the encoding should have at least 2t+1 bit-positions that change from 1 to 0 per Hamming weight, and wherein the ECC is configured to have a minimum Hamming distance of at least 4t+1 in order to correct up to t bit errors and detect up to 3t bit errors where t≥1; correct the first encoded data with the ECC as corrected encoded data, including error detection of up to at least 3t errors and correction of up to t errors; decode the corrected encoded data with the ECC as decoded data; decode the encoded Hamming weight, including error correction and possibly checking for decoding errors; determine the Hamming weight of the corrected encoded data; check that the decoded Hamming weight and the determined Hamming weight are equal, that the data decoding did not detect more than t errors, and the Hamming weight decoding has not detected a decoding error; and return the decoded data if all checks have passed, otherwise returning an error.

Various embodiments are described, wherein the encoded Hamming weight includes 2t+1 inverted Hamming weights, and the decoding of the encoded Hamming weight includes determining the bit-wise majority vote of the 2t+1 inverted Hamming weights, and inverting the majority vote.

Various embodiments are described, wherein the decoding of the encoded Hamming weight includes trying all possible Hamming weights and checking if one would generate an encoding that has a Hamming distance of at most t to the encoded Hamming weight, returning the possible Hamming weight if it has passed the check, else returning an error.

Various embodiments are described, wherein the encoded Hamming weight includes a first encoded Hamming weight and an inverted second encoded Hamming weight, where the first and second encoded Hamming weights are each encoded with an error correcting code (ECC), wherein the ECC is configured to have a minimum Hamming distance of at least 2t+1; and the decoding of the encoded Hamming weight includes decoding the first encoded Hamming weight with c1 corrections, inverting the inverted second encoded Hamming weight, decoding the second encoded Hamming weight with c2 corrections, checking if both decoding operations result in the same Hamming weight and if c1+c2≤t bits were corrected, returning the first decoded Hamming weight if the check has been passed, else returning an error.

Various embodiments are described, wherein when the Hamming weight is always even, the last significant bit of the Hamming weight is not used.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

BRIEF DESCRIPTION OF DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Figure 1:
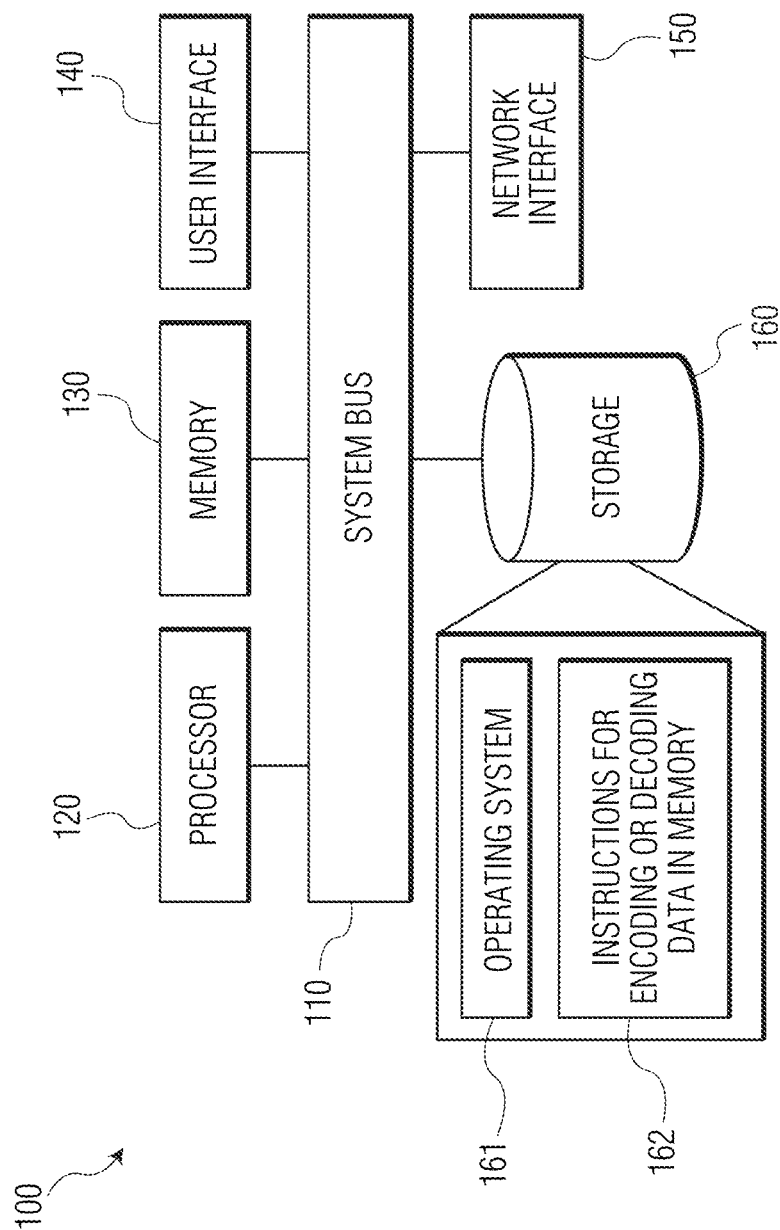
FIG. 1 illustrates an exemplary hardware diagram for implementing a memory encoding and decoding method as described above.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of encoding of data storage systems will now be presented with reference to various apparatuses and techniques. These apparatuses and techniques will be described in the following detailed description and illustrated in the accompanying drawings by various blocks, modules, components, circuits, steps, processes, algorithms, and/or the like (collectively referred to as "elements"). These elements may be implemented using hardware, software, or combinations thereof. Whether such elements are implemented as hardware or software depends upon the particular application and design constraints imposed on the overall system.

In the world of IoT or RFID devices, but also other scenarios, it is possible that during writing a word to memory or erasing a memory word that power is lost and the operation is teared. In such cases the system should be able to detect this, such that it could retry or repair the issue, depending on the circumstances.

Embodiments will be described that illustrate how memory content may be encoded in a way that it can be written or erased in a tearing-save way. These embodiments are an extension of U.S. Pat. No. 10,944,435, which is hereby incorporated for all purposes as if included herein. The assumption regarding writing and erasing is that tearing-errors can only happen in one direction, meaning that either not all 1s are programmed, or not all 1s are erased, so a read 0-bit could actually be 1 or 0, but a read 1-bit is always a 1, or depending on the polarity of the memory the other way around. The disclosed memory encoding even works if there is an additional arbitrary one-bit-error and an error correcting code that may correct the one bit error. For multiple bit errors this gets a bit more complex but is also possible and scales. For multiple bit errors the situation is more complex, but it is also possible to correct such errors as well. Likewise, embodiments for decoding such encoded data read from the memory will also be described.

The solution to this problem described herein includes adding an error detection code (EDC) that is dedicated to unidirectional errors. This may be implemented using an inverted Hamming weight or so-called Berger code. In addition, this will be combined with an error correction code (ECC), that may correct one arbitrary (symmetric) error. Because this may lead to the situation where this ECC wrongly corrects a bit because of multiple tearing errors or rightly corrects an arbitrary error, up to two arbitrary (symmetric) errors after the error correction need to be considered.

This situation may be accommodated by expanding the ECC by some additional error detection capability (so increasing the minimal Hamming distance of the code) and repeating the inverted Hamming weight 2t+1 times. There are also other options to encode the Hamming weight also for multiple bit errors, but they are less canonical and will be explained later.

First, a simple case will be examined where only unidirectional errors occur and no additional arbitrary (symmetric) errors occur. In this case errors can only happen in one direction, which means that read 1-bits in flash are always 1 but read 0-bits could either be 0 or should have been a 1. This could either happen because a 1 was not fully programmed or not all 1-bits have been fully erased. Depending on the polarity of the flash this could also be the other way around (0<=>1), which implies that the scheme could also be used in case where it is wanted to overwrite a flash word with all 1-bits, for example to invalidate this flash word. In this situation a Berger code can be used to detect such incomplete operations. A Berger code is simply the inverted binary encoded Hamming weight of the data, and the Hamming weight is the number of 1-bits in the data. Alternatively, one could also use the binary encoding of the number of 0-bits in the data instead of the inverted Hamming weight. This works because an increasing Hamming weight in this check value would imply an increasing check value which would imply a decreasing Hamming weight of the data, because of the inversion or counting of 0-bits. So, errors where 1-bits could result in 0-bits in flash would imply a lower Hamming weight in the actual data and/or a higher expected Hamming weight by the check value, but the actual and expected Hamming weight could only match if there was no such error at all.

Encoding the data may be accomplished as shown in the following pseudocode:
1. Encode(data):
2. return data||~HW(data)

Decoding the data may be accomplished as shown in the following pseudocode:
1. Decode(data||check):
2. if (~HW(data)==check): ok, return data
3. else: error Here "||" means concatenation and "~" means bit-wise inversion or 1-complement, and HW(x) the Hamming weight of x. The number of bits needed for the check value is $k=\log_2[m+1]=\log_2[m]+1$, where m is the number of bits in data. The total length of the encoded flash word would then be n=m+k.

Now the actual problem will be discussed, that is the situation where there could also be t arbitrary (symmetric) errors (in the other direction) on top of the unidirectional errors. For memory this is usually expected and some error correction code (ECC) is implemented in the memory controller to correct such errors during reads. Typically, this is a one-error-correcting code, e.g., a Hamming code, but for other types of memory it could also be a multi-bit correcting code, usually then a BCH code. Because the combination of multiple unidirectional errors and t arbitrary errors cannot be handled by a t-error correcting code, it will most likely result in a mis-correction and hence in more arbitrary errors. For example, if two unidirectional errors and one other error occurs in the data, an implied mis-correction could lead to another error, then the Hamming weight would still be the same and hence could not be detected by any Hamming-weight-based check alone.

The situation where error correction results in mis-corrections needs to be avoided. This may be achieved by extending the code such that it could also detect up to 3·t errors, but only corrects up to t. Then mis-corrections can only happen if more than t bidirectional and 2·t unidirectional errors happen. But more than t bidirectional errors cannot happen (reliability assumption), and with more than 2·t unidirectional errors plus at most t mis-corrections the original Hamming weight cannot be reached anymore, such that the Hamming weight check will detect it. This can, e.g., be achieved with a BCH code with minimum distance d=4·t+1. Because this is always odd, such BCH codes may be extended by a parity bit to actually get d=4·t+2, which generates code words with even Hamming weight and hence the least significant bit of the Hamming weight can be ignored. So now 2·t+1 times the inverted Hamming weight divided by two will be added. If other codes are used where an even Hamming weight cannot be achieved, then the least significant bit cannot be ignored, but that is usually not the case.

For reading/checking, the ECC is first performed to correct any errors that may be present and that might also be a mis-correction; then the Hamming weight is computed and checked using majority voting to correct normal errors that might also mis-correct unidirectional errors, but which again would lead to a mismatch in Hamming weight. Encoding the data may be accomplished as shown in the following pseudocode:
1. Encode(data):
2. ecc:=ECCenc(data)//assuming only even Hamming weights
3. hw:=HW(data||ecc)/2//ignore least significant bit
4. return data||ecc||~hw[1]|| . . . ||~hw[2t+1]

First the input data is encoded using an ECC at line 2. This assumes only even Hamming weights. Then the Hamming weight of data concatenated with the ECC is determined and then divided by 2 at line 3. Finally, the data, ECC, and 2t+1 copies of the inverted Hamming weight are concatenated as the encoded data at line 4.

Decoding the data may be accomplished as shown in the following pseudocode:

1. Decode(data||ecc||~hw[1]|| . . . ||~hw[2t+1]):
2. data'||ecc':=ECCdec(data||ecc)
3. compute ~hw' as bit wise majority vote of ~hw[1], . . . , ~hw[2t+1]
4. check if hw'==HW(data'||ecc')/2?
5. if checks pass: return data'
6. else: error First, the data concatenated with the ECC value is decoded using the ECC decoding at line 2. Here x':=ECCdec(x) means that the error correction algorithm shall be applied to x and the corrected data will be x'. Further, the ECCdec(x) will also detect if there are more than t errors but at most 3t errors. If so, ECCdec(x) will indicate an error. Next, ~hw' is computed by using a bitwise majority vote of ~hw[1], . . . , ~hw[2t+1] at line 3. The Hamming weight of data'||ecc' is determined and then divided by 2 and compared to hw' at line 4. If the checks pass (which may include a check associated with the ECC decoding operation), then the data is returned at line 5. Otherwise, an error is returned at line 6.

Why this works will now be described. After the error correction in step 2 of the decoding, as explained above, either the data has been corrected correctly, or the data has been mis-corrected, but if the data is mis-corrected then the Hamming weight is reduced. The majority vote decoding of the inverted Hamming weights ~hw' may also only decrease or keep the Hamming weight the same, because only bidirectional errors could increase the Hamming weight, but there are at most t bidirectional errors so a majority can never result. This means the actual decoded Hamming weight hw' (after inversion) either is correct or is larger than the original Hamming weight. So if the Hamming weight check passes it also means that there was not a mis-correction in the ECC.

Table 1 presents some examples of how many bits would be needed for such an encoding. Table 1 illustrates the data sizes of 16, 32, 64, 128, 256 versus errors of 0, 1, 2, and 3.

TABLE 1

| size\t | 0 | 1 | 2 | 3 |
|---|---|---|---|---|
| 16 | 21 | 39 | 61 | 81 |
| 32 | 38 | 60 | 82 | 110 |
| 64 | 71 | 97 | 123 | 149 |
| 128 | 136 | 166 | 196 | 226 |
| 256 | 265 | 299 | 333 | 367 |

So this approach has costly overhead, but on the other hand it is also handling a lot of errors.

The described solution with repeating the inverted Hamming weight multiple times may not be optimal regarding the number of additional bits needed. What is needed is an encoding of the data||ecc Hamming weight such that at least 2t+1 bits of this encoding are changing from 1 to 0 if the Hamming weight is increasing. For example, instead of using 3×4=12 bits to encode Hamming weights 0-15 by simple repeating the inverted Hamming weight three times, one could use the following 11-bit encoding to encode Hamming weights 0-27:

0: 11111111111
1: 00011111111
2: 11100011111
3: 11111100011
4: 01101101101
5: 10110110101
6: 11011011001
7: 11010101110
8: 01111010110
9: 10101111010
10: 10001001111
11: 01000110111
12: 00110011011
13: 00011100011
14: 11100000011
15: 01010001101
16: 00101010101
17: 10000111001
18: 00100101110
19: 10010010110
20: 01001011010
21: 11001100100
22: 10111001000
23: 01110110000
24: 00000000111
25: 00010011000
26: 00101100000
27: 11000000000

There are some ways to generalize the search for such better encodings versus using ~hw[1]|| . . . ||~hw[2t+1]. A first example includes doing a kind brute-force search starting with the all-ones word, but this is limited due to quickly increasing sizes and runtime. A second example includes using a normal 2t+1 code and repeat the code word inverted, i.e.:

a. HWecc=ECC(hw)
b. HW||HWecc||~HW||~HWecc.

In this example, step 3 of the decoding will then be replaced by hw'=decode(HW||HWecc||~HW||~HWecc). Then all possible hw encodings may be tried and checked to see if one of them has a Hamming distance of at most t. This would be the decoded candidate. If none is found an error may be raised. Again a mis-correction might happen, but it could only increase the decoded Hamming weight. This may be accomplished using the following pseudocode:

1. readHWenc:=HW||HWecc||~HW||~HWecc
2. For all possible Hamming weights tHW:
3. ·tHWecc=ECC(tHW)
4. ·tHWenc=tHW||tHWecc||~tHW||~tHWecc
5. hd=HammingDistance(readHWenc, tHWenc)=HW (readHWenc<+>tHWenc)
6. if hd≤t: return tHW
7. if no hd was≤t: return ERROR The following pseudocode demonstrates another method for decoding this alternate encoding:

1. decode HW||HWecc to hw1 with c1 corrections
2. invert ~HW||~HWecc to HW'||HWecc'
3. decode HW'||HWecc' to hw2 with c2 corrections
4. If hw1==hw2 and c1+c2≤t
5. return hw1,
6. else
7. return error This approach decodes the two separate portions HW||HWecc and ~HW||~HWecc and determines the number of corrections in each, c1 and c2 respectively. Then the decoded values hw1 and hw2 are compared to see if they are equal. Also it is determined if c1+c2 is less than or equal to t. If both of these conditions are met, then the value hw 1 is returned. Otherwise and error is returned.

A third example includes using a normal 2t+1 code and remove words that do not respect the extended properties.

For the first option c values may be encoded in k bits for given t as follows in Table 2:

TABLE 2

| k\t | 1 | 2 | 3 |
|---|---|---|---|
| 7 | 4 | 2 | 2 |
| 8 | 7 | 2 | 2 |
| 9 | 10 | 2 | 2 |
| 10 | 16 | 4 | 2 |
| 11 | 28 | 4 | 2 |
| 12 | 41 | 4 | 2 |
| 13 | 70 | 6 | 2 |
| 14 | 120 | 8 | 4 |
| 15 | 192 | 10 | 4 |
| 16 | 320 | 16 | 4 |
| 17 | 547 | 22 | 4 |
| 18 | 921 | 36 | 6 |
| 19 | ...(?) | 47 | 7 |
| 20 | ...(?) | 69 | 8 |
| 21 | ...(?) | 101 | 10 |

Note that for t=1 and k=19, 20, and 21, it was difficult to find values for c. Further, it is noted that this search might not have been optimal.

For the second option Table 3 shows the number of k bits to store c values for given t.

TABLE 3

| c\t | 1 | 2 | 3 |
|---|---|---|---|
| 16 | 14 | 22 | 28 |
| 32 | 18 | 26 | 30 |
| 64 | 20 | 28 | 34 |
| 128 | 22 | 30 | 36 |
| 256 | 24 | 32 | 38 |
| 512 | 26 | 34 | 40 |
| 1024 | 28 | 38 | 42 |

Note that this encoding is not always better than simple 2t+1 repetition code described above. The numbers with no highlighting show better performance, the numbers highlighted in light grey show the same performance, and the number shaded in dark grey show worse performance. On the other hand, this option is always worse than the first option.

For the third option c values may be encoded in k bits for given t as illustrated in Table 4.

TABLE 4

| k\t | 1 | 2 | 3 |
|---|---|---|---|
| 7 | 3 | — | — |
| 8 | 4 | 1 | — |
| 9 | 6 | 1 | — |
| 10 | 11 | 2 | — |
| 11 | 22 | 2 | 1 |
| 12 | 32 | 2(4) | 1 |
| 13 | 48 | 2(4) | 1 |
| 14 | 81 | 4 | 2 |
| 15 | 129 | 4 | 2 |
| 16 | 189 | 7 | 2(4) |
| 17 | 328 | 11 | 2(4) |
| 18 | 553 | 11 | 2(4) |
| 19 | 970 | 17 | 4 |
| 20 | 1715 | 32 | 4(6) |
| 21 | 3020 | 51 | 6 |
| 22 | | 77 | 8 |
| 23 | | 109 | 10 |
| 24 | | 178 | (12) |

TABLE 4-continued

| k\t | 1 | 2 | 3 |
|---|---|---|---|
| 25 | | 296 | (12) |
| 26 | | 468 | 12 |
| 27 | | | 12 |
| 28 | | | 16 |
| 29 | | | 26 |
| 30 | | | 36 |
| 31 | | | 68 |
| 33 | | | 106 |
| 34 | | | 199 |
| 35 | | | 379 |

So this third option is a kind of trade-off between the first and second options, i.e., not quite as space efficient, but therefore faster to find the encoding, but it may be stored more compressed than the first option.

If the best HW-encoding from the various approached is determined, then the following total encoding results as shown in Table 5.

TABLE 5

| size\t | 0 | 1 | 2 | 3 |
|---|---|---|---|---|
| 16 | 21 | 38 | 56 | 78 |
| 32 | 38 | 58 | 77 | 102 |
| 64 | 71 | 93 | 114 | 141 |
| 128 | 136 | 160 | 185 | 211 |
| 256 | 265 | 291 | 318 | 346 |

Thus depending on the size of the data words and the number of errors to be corrected different encoding schemes can be used that were developed using different search approaches.

FIG. 1 illustrates an exemplary hardware diagram 100 for implementing a memory encoding and decoding method as described above. As shown, the device 100 includes a processor 120, memory 130, user interface 140, network interface 150, and storage 160 interconnected via one or more system buses 110. It will be understood that FIG. 1 constitutes, in some respects, an abstraction and that the actual organization of the components of the device 100 may be more complex than illustrated.

The processor 120 may be any hardware device capable of executing instructions stored in memory 130 or storage 160 or otherwise processing data. As such, the processor may include a microprocessor, microcontroller, graphics processing unit (GPU), neural network processor, field programmable gate array (FPGA), application-specific integrated circuit (ASIC), or other similar devices. The processor may be a secure processor or include a secure processing portion or core that resists tampering.

The memory 130 may include various memories such as, for example L1, L2, or L3 cache or system memory. As such, the memory 130 may include static random-access memory (SRAM), dynamic RAM (DRAM), flash memory, read only memory (ROM), or other similar memory devices. Further, some portion or all of the memory may be secure memory with limited authorized access and that is tamper resistant.

The user interface 140 may include one or more devices for enabling communication with a user as needed. For example, the user interface 140 may include a display, a touch interface, a mouse, and/or a keyboard for receiving user commands. In some embodiments, the user interface 140 may include a command line interface or graphical user interface that may be presented to a remote terminal via the network interface 150.

The network interface 150 may include one or more devices for enabling communication with other hardware devices. For example, the network interface 150 may include a network interface card (NIC) configured to communicate according to the Ethernet protocol or other communications protocols, including wireless protocols. Additionally, the network interface 150 may implement a TCP/IP stack for communication according to the TCP/IP protocols. Various alternative or additional hardware or configurations for the network interface 150 will be apparent.

The storage 160 may include one or more machine-readable storage media such as read-only memory (ROM), random-access memory (RAM), magnetic disk storage media, optical storage media, flash-memory devices, or similar storage media. In various embodiments, the storage 160 may store instructions for execution by the processor 120 or data upon with the processor 120 may operate. For example, the storage 160 may store a base operating system 161 for controlling various basic operations of the hardware 100. The storage 162 may include instructions for implementing the memory encoding and decoding method described above.

It will be apparent that various information described as stored in the storage 160 may be additionally or alternatively stored in the memory 130. In this respect, the memory 130 may also be considered to constitute a "storage device" and the storage 160 may be considered a "memory." Various other arrangements will be apparent. Further, the memory 130 and storage 160 may both be considered to be "non-transitory machine-readable media." As used herein, the term "non-transitory" will be understood to exclude transitory signals but to include all forms of storage, including both volatile and non-volatile memories.

The system bus 110 allows communication between the processor 120, memory 130, user interface 140, storage 160, and network interface 150.

While the host device 100 is shown as including one of each described component, the various components may be duplicated in various embodiments. For example, the processor 120 may include multiple microprocessors that are configured to independently execute the methods described herein or are configured to perform steps or subroutines of the methods described herein such that the multiple processors cooperate to achieve the functionality described herein. Further, where the device 100 is implemented in a cloud computing system, the various hardware components may belong to separate physical systems.

Figure 2:
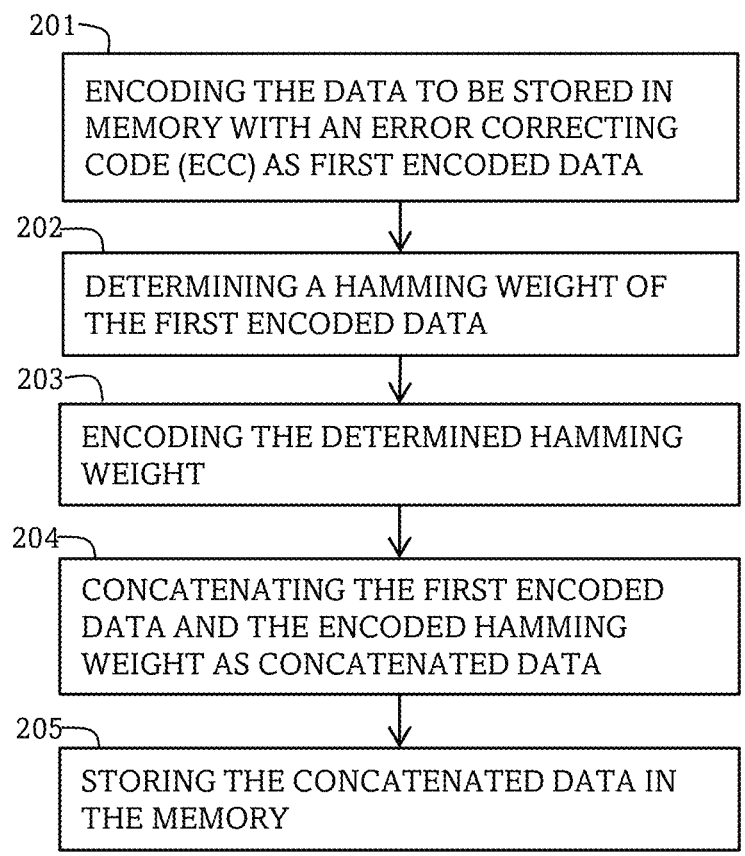
FIG. 2 illustrates a method for encoding data to be stored in a memory according to an embodiment.

FIG. 2 illustrates method 200 for encoding data to be stored in a memory according to an embodiment. Method 200 begins at step 201. At step 201, the data to be stored in memory is encoded with an error correcting code (ECC) as first encoded data. The ECC is configured to have a minimum Hamming distance of at least 4t+1 in order to correct up to t bit errors and detect up to 3t bit errors where t≥1. At step 202, a Hamming weight of the first encoded data is determined. At step 203, the determined Hamming weight is encoded. For all higher Hamming weights the encoding should have at least 2t+1 bit-positions that change from 1 to 0 per Hamming weight. At step 204, the first encoded data and the encoded Hamming weight are concatenated as concatenated data. At step 205, the concatenated data is stored in the memory.

Figure 3:
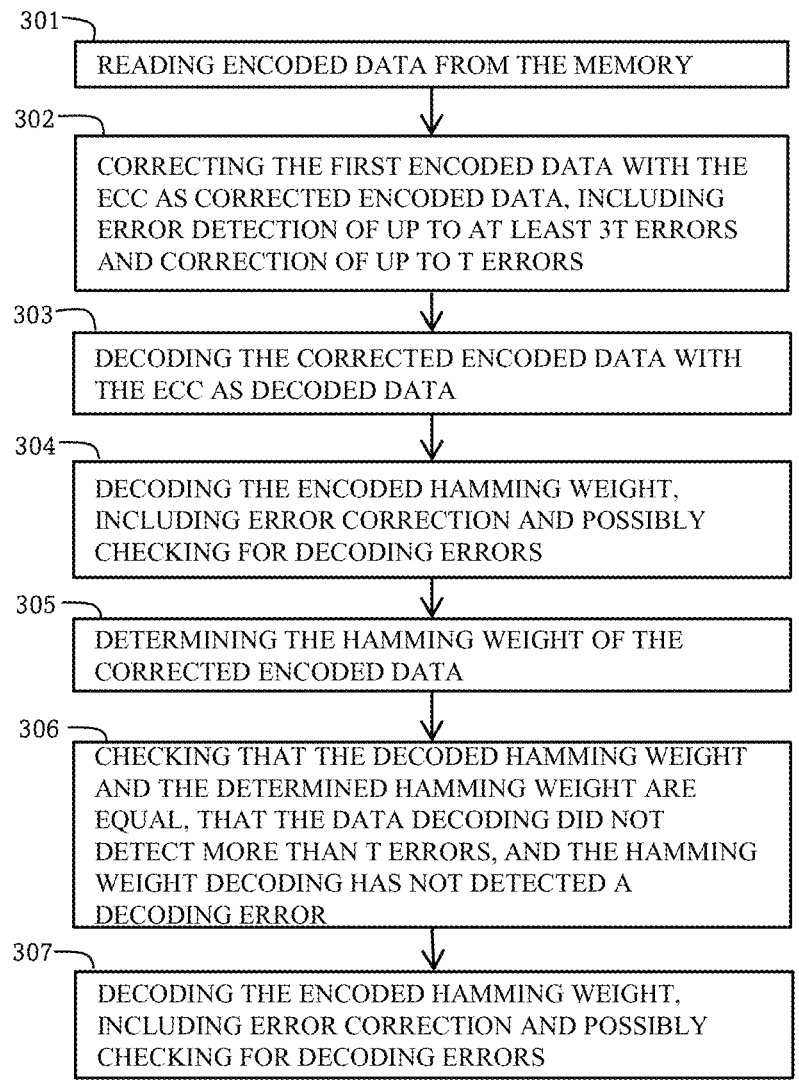
FIG. 3 illustrates a method for decoding data stored in a memory according to an embodiment.

FIG. 3 illustrates method 300 for decoding data stored in a memory according to an embodiment. At step 301, encoded data is read from the memory. The encoded data includes a first encoded data, generated using an error correcting code (ECC), and the encoded Hamming weight. For all higher Hamming weights the encoding should have at least 2t+1 bit-positions that change from 1 to 0 per Hamming weight. The ECC is configured to have a minimum Hamming distance of at least 4t+1 in order to correct up to t bit errors and detect up to 3t bit errors where t≥1. At step 302, the first encoded data is corrected with the ECC as corrected encoded data, including error detection of up to at least 3t errors and correction of up to t errors. At step 303, the corrected encoded data is decoded with the ECC as decoded data. At step 304, the encoded Hamming weight is decoded, including error correction and possibly checking for decoding errors. At step 305, the Hamming weight of the corrected encoded data is determined. At step 306, the decoded Hamming weight and the determined Hamming weight are checked that they are equal, that the data decoding did not detect more than t errors, and the Hamming weight decoding has not detected a decoding error. At step 307, the decoded data is returned if all checks have passed, otherwise returning an error.

The foregoing disclosure provides illustration and description but is not intended to be exhaustive or to limit the aspects to the precise form disclosed. Modifications and variations may be made in light of the above disclosure or may be acquired from practice of the aspects.

As used herein, the term "component" is intended to be broadly construed as hardware, firmware, and/or a combination of hardware and software. As used herein, a processor is implemented in hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, and/or the like. It will be apparent that systems and/or methods described herein may be implemented in different forms of hardware, firmware, and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, the term "non-transitory machine-readable storage medium" will be understood to exclude a transitory propagation signal but to include all forms of volatile and non-volatile memory. When software is implemented on a processor, the combination of software and processor becomes a specific dedicated machine.

Because the data processing implementing the embodiments described herein is, for the most part, composed of electronic components and circuits known to those skilled in the art, circuit details will not be explained in any greater extent than that considered necessary as illustrated above, for the understanding and appreciation of the underlying concepts of the aspects described herein and in order not to obfuscate or distract from the teachings of the aspects described herein.

Unless stated otherwise, terms such as "first" and "second" are used to arbitrarily distinguish between the elements such terms describe. Thus, these terms are not necessarily intended to indicate temporal or other prioritization of such elements.

It should be appreciated by those skilled in the art that any block diagrams herein represent conceptual views of illustrative hardware embodying the principles of the aspects.

While each of the embodiments are described above in terms of their structural arrangements, it should be appreciated that the aspects also cover the associated methods of using the embodiments described above.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. A phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Furthermore, as used herein, the terms "set" and "group" are intended to include one or more items (e.g., related items, unrelated items, a combination of related and unrelated items, and/or the like), and may be used interchangeably with "one or more." Where only one item is intended, the phrase "only one" or similar language is used. Also, as used herein, the terms "has," "have," "having," and/or the like are intended to be open-ended terms. Further, the phrase "based on" is intended to mean "based, at least in part, on" unless explicitly stated otherwise.

The invention claimed is:

1. A method for encoding data to be stored in a memory, comprising:
    encoding the data to be stored in memory with an error correcting code (ECC) as first encoded data, wherein the ECC is configured to have a minimum Hamming distance of at least 4t+1 in order to correct up to t bit errors and detect up to 3t bit errors where $t \geq 1$;
    determining a Hamming weight of the first encoded data;
    encoding the determined Hamming weight, wherein for all higher Hamming weights the encoding should have at least 2t+1 bit-positions that change from 1 to 0 per Hamming weight;
    concatenating the first encoded data and the encoded Hamming weight as concatenated data; and
    storing the concatenated data in the memory.

2. The method of claim 1, wherein the encoding of the determined Hamming weight comprises:
    inverting the determined Hamming weight; and
    concatenating 2t+1 copies of the inverted Hamming weight.

3. The method of claim 1, wherein the encoding of the determined Hamming weight comprises
    encoding the determined Hamming weight with an error correcting code (ECC) as first encoded Hamming weight, wherein the ECC is configured to have a minimum Hamming distance of at least 2t+1 where t is a same t as for the data encoding;
    inverting the first encoded Hamming weight; and
    concatenating the first encoded Hamming weight and the inverted first encoded Hamming weight.

4. The method of claim 1, wherein when the Hamming weight is always even, a last significant bit of the Hamming weight is not used.

5. A method for decoding data stored in a memory, comprising:
    reading encoded data from the memory, wherein the encoded data includes a first encoded data, generated using an error correcting code (ECC), and the encoded Hamming weight, wherein for all higher Hamming weights the encoding should have at least 2t+1 bit-positions that change from 1 to 0 per Hamming weight, and wherein the ECC is configured to have a minimum Hamming distance of at least 4t+1 in order to correct up to t bit errors and detect up to 3t bit errors where $t \geq 1$;
    correcting the first encoded data with the ECC as corrected encoded data, including error detection of up to at least 3t errors and correction of up to t errors;
    decoding the corrected encoded data with the ECC as decoded data;
    decoding the encoded Hamming weight, including error correction and possibly checking for decoding errors;
    determining the Hamming weight of the corrected encoded data;
    checking that the decoded Hamming weight and the determined Hamming weight are equal, that the data decoding did not detect more than t errors, and the Hamming weight decoding has not detected a decoding error; and
    returning the decoded data if all checks have passed, otherwise returning an error.

6. The method of claim 5, wherein
    the encoded Hamming weight comprises 2t+1 inverted Hamming weights, and
    the decoding of the encoded Hamming weight comprises
        determining a bit-wise majority vote of the 2t+1 inverted Hamming weights, and
        inverting the majority vote.

7. The method of claim 5, wherein the decoding of the encoded Hamming weight comprises
    trying all possible Hamming weights and checking if one would generate an encoding that has a Hamming distance of at most t to the encoded Hamming weight, and
    returning the possible Hamming weight if it has passed the check, else returning an error.

8. The method of claim 5, wherein
    the encoded Hamming weight comprises a first encoded Hamming weight and an inverted second encoded Hamming weight, where the first and second encoded Hamming weights are each encoded with an error correcting code (ECC), wherein the ECC is configured to have a minimum Hamming distance of at least 2t+1; and
    the decoding of the encoded Hamming weight comprises
        decoding the first encoded Hamming weight with c1 corrections,
        inverting the inverted second encoded Hamming weight,
        decoding the second encoded Hamming weight with c2 corrections,
        checking if both decoding operations result in the same Hamming weight and if $c1+c2 \leq t$ bits were corrected, and
        returning the first decoded Hamming weight if the check has been passed, else returning an error.

9. The method of claim 5, wherein when the Hamming weight is always even, a last significant bit of the Hamming weight is not used.

10. A device configured to encode data stored in a first memory, comprising:
　a second memory;
　a processor coupled to the second memory, wherein the processor is further configured to:
　　encode the data to be stored in memory with an error correcting code (ECC) as first encoded data, wherein the ECC is configured to have a minimum Hamming distance of at least 4t+1 in order to correct up to t bit errors and detect up to 3t bit errors where t≥1;
　　determine a Hamming weight of the first encoded data;
　　encode the determined Hamming weight, wherein for all higher Hamming weights the encoding should have at least 2t+1 bit-positions that change from 1 to 0 per Hamming weight;
　　concatenate the first encoded data and the encoded Hamming weight as concatenated data; and
　　store the concatenated data in the memory.

11. The device of claim 10, wherein the encoding of the determined Hamming weight comprises:
　inverting the determined Hamming weight; and
　concatenating 2t+1 copies of the inverted Hamming weight.

12. The device of claim 10, wherein the encoding of the determined Hamming weight comprises
　encoding the determined Hamming weight with an error correcting code (ECC) as first encoded Hamming weight, wherein the ECC is configured to have a minimum Hamming distance of at least 2t+1 where t is a same t as for the data encoding;
　inverting the first encoded Hamming weight; and
　concatenating the first encoded Hamming weight and the inverted first encoded Hamming weight.

13. The device of claim 10, wherein when the Hamming weight is always even, a last significant bit of the Hamming weight is not used.

14. A device configured to decode data stored in a first memory, comprising:
　a second memory;
　a processor coupled to the second memory, wherein the processor is further configured to:
　　read encoded data from the memory, wherein the encoded data includes a first encoded data, generated using an error correcting code (ECC), and the encoded Hamming weight, wherein for all higher Hamming weights the encoding should have at least 2t+1 bit-positions that change from 1 to 0 per Hamming weight, and wherein the ECC is configured to have a minimum Hamming distance of at least 4t+1 in order to correct up to t bit errors and detect up to 3t bit errors where t≥1;
　　correct the first encoded data with the ECC as corrected encoded data, including error detection of up to at least 3t errors and correction of up to t errors;
　　decode the corrected encoded data with the ECC as decoded data;
　　decode the encoded Hamming weight, including error correction and possibly checking for decoding errors;
　　determine the Hamming weight of the corrected encoded data;
　　check that the decoded Hamming weight and the determined Hamming weight are equal, that the data decoding did not detect more than t errors, and the Hamming weight decoding has not detected a decoding error; and
　　return the decoded data if all checks have passed, otherwise returning an error.

15. The device of claim 14, wherein
the encoded Hamming weight comprises 2t+1 inverted Hamming weights, and
the decoding of the encoded Hamming weight comprises
　determining a bit-wise majority vote of the 2t+1 inverted Hamming weights, and
　inverting the majority vote.

16. The device of claim 14, wherein
the decoding of the encoded Hamming weight comprises
　trying all possible Hamming weights and checking if one would generate an encoding that has a Hamming distance of at most t to the encoded Hamming weight, and
　returning the possible Hamming weight if it has passed the check, else returning an error.

17. The device of claim 14, wherein
the encoded Hamming weight comprises a first encoded Hamming weight and an inverted second encoded Hamming weight, where the first and second encoded Hamming weights are each encoded with an error correcting code (ECC), wherein the ECC is configured to have a minimum Hamming distance of at least 2t+1; and
the decoding of the encoded Hamming weight comprises
　decoding the first encoded Hamming weight with c1 corrections,
　inverting the inverted second encoded Hamming weight,
　decoding the second encoded Hamming weight with c2 corrections,
　checking if both decoding operations result in the same Hamming weight and if c1+c2≤t bits were corrected,
　returning the first decoded Hamming weight if the check has been passed, else returning an error.

18. The device of claim 14, wherein when the Hamming weight is always even, a last significant bit of the Hamming weight is not used.

* * * * *